(12) United States Patent
Louwsma et al.

(10) Patent No.: US 10,862,391 B2
(45) Date of Patent: Dec. 8, 2020

(54) ANALOG-TO-DIGITAL CONVERTER USING CHARGE PACKETS

(71) Applicant: TELEDYNE DALSA B.V., Eindhoven (NL)

(72) Inventors: Simon M. Louwsma, Enschede (NL); Paul F. J. Geraedts, Enschede (NL)

(73) Assignee: TELEDYNE DALSA B.V., Eindhoven (NL)

( * ) Notice: Subject to any disclaimer, the term of this patent is extended or adjusted under 35 U.S.C. 154(b) by 0 days.

(21) Appl. No.: 16/332,937

(22) PCT Filed: Mar. 31, 2017

(86) PCT No.: PCT/NL2017/050198
§ 371 (c)(1),
(2) Date: Mar. 13, 2019

(87) PCT Pub. No.: WO2018/182402
PCT Pub. Date: Oct. 4, 2018

(65) Prior Publication Data
US 2020/0014297 A1   Jan. 9, 2020

(51) Int. Cl.
*H03M 1/10* (2006.01)
*H02M 3/07* (2006.01)
(Continued)

(52) U.S. Cl.
CPC ............ *H02M 3/07* (2013.01); *H03M 1/38* (2013.01); *H04N 5/37455* (2013.01)

(58) Field of Classification Search
CPC .. H02M 2001/007; H02M 3/156; H03M 5/08; H03M 1/12; H03M 1/466;
(Continued)

(56) References Cited

U.S. PATENT DOCUMENTS

| 3,585,634 A | 6/1971 | Sharples |
| 4,144,527 A | 3/1979 | Butler et al. |

(Continued)

FOREIGN PATENT DOCUMENTS

| JP | 2004-158138 A | 6/2004 |
| JP | 2017-050776 A | 3/2017 |

(Continued)

OTHER PUBLICATIONS

International Search Report and Written Opinion of the International Searching Authority for International Application No. PCT/NL2017/050198 dated Jan. 26, 2018.
(Continued)

*Primary Examiner* — Linh V Nguyen
(74) *Attorney, Agent, or Firm* — K&L Gates LLP

(57) ABSTRACT

The present invention relates to a converting device for converting an analog voltage into a digital number and to an imaging system comprising the same. The invention further relates to a method for converting an analog voltage into a digital number.

According to the invention, one or more charge pumping steps are performed that change a voltage over a capacitive element that has been set in dependence of the voltage to be converted. During each charge pumping step, one or more substantially identical charge packets may be transferred to of from the capacitive element. The magnitude of the charge packets belonging to different charge pumping steps may be different allowing multi-slope operation.

The digital number representing the analog voltage is calculated based on the net charge that has been injected into or removed from the main capacitive element as a result of having performed the one or more charge pumping steps.

19 Claims, 5 Drawing Sheets

(51) Int. Cl.
  *H03M 1/38* (2006.01)
  *H04N 5/3745* (2011.01)
(58) Field of Classification Search
  CPC .... H03M 1/124; H03M 1/1245; H03M 3/458;
   H03M 7/10; H03M 1/363; H03M 1/462;
   H03M 1/56
  USPC ............... 341/118–122, 137, 139, 140, 172
  See application file for complete search history.

(56) References Cited

U.S. PATENT DOCUMENTS

| | | | | |
|---|---|---|---|---|
| 5,303,027 | A * | 4/1994 | Kuderer | G01J 1/46 250/208.2 |
| 5,847,594 | A * | 12/1998 | Mizuno | H04N 5/335 327/514 |
| 6,930,300 | B1 * | 8/2005 | Douma | H04B 10/69 250/214 A |
| 6,977,601 | B1 * | 12/2005 | Fletcher | H03M 3/32 341/143 |
| 8,084,727 | B2 * | 12/2011 | Rostaing | G01J 5/30 250/208.1 |
| 8,519,879 | B1 * | 8/2013 | Denham | H03M 1/60 341/155 |
| 8,803,064 | B2 * | 8/2014 | Mizuno | H04N 5/378 250/214 A |
| 9,337,856 | B1 | 5/2016 | Dhawan et al. | |
| 10,520,358 | B2 * | 12/2019 | Guennewig | G01J 3/28 |
| 2003/0201777 | A1 * | 10/2003 | Gogoi | G01D 21/00 324/415 |
| 2009/0108207 | A1 * | 4/2009 | Liu | H01L 27/14609 250/366 |

FOREIGN PATENT DOCUMENTS

| | | |
|---|---|---|
| WO | WO 96/10297 A1 | 4/1996 |
| WO | WO 97/32401 A1 | 9/1997 |

OTHER PUBLICATIONS

Peizerat et al., "Pixel-level A/D conversion: comparison of two charge packets counting techniques", 2007 International Image Sensor Workshop, Ogunquit, Maine, Jun. 7. 2007, pp. 200-203.

* cited by examiner

FIG. 5

ANALOG-TO-DIGITAL CONVERTER USING CHARGE PACKETS

PRIORITY

This application is a U.S. National Stage Entry under 35 U.S.C. § 371 of International Application serial number PCT/NL2017/050198, entitled ANALOG-TO-DIGITAL CONVERTER USING CHARGE PACKETS, filed on Mar. 31, 2017, the disclosure of which is incorporated herein by reference in its entirety and for all purposes.

FIELD OF THE INVENTION

The present invention relates to a converting device for converting an analog voltage into a digital number and to an imaging system comprising the same. The invention further relates to a method for converting an analog voltage into a digital number.

BACKGROUND

Contemporary imaging systems have sensors that often comprise a pixel array of photosensitive pixels. These pixels are arranged in rows and columns and comprise a photosensitive component, such as a PIN diode, that is coupled to a storage capacitor. During a predetermined amount of time, light is collected by the photosensitive component and a corresponding current is outputted. The charge associated with this current is stored in the storage capacitor. After the predetermined amount of time has passed, the voltage over the storage capacitor, referred to as the pixel voltage, is read out and is subsequently converted into a digital number for further processing. If the pixel did not saturate, the digital number is representative for the amount of light that fell onto the pixel during the predetermined amount of time.

Typically, the sensors are equipped with selecting circuitry for selecting individual rows of pixels and with read-out circuitry for reading out the pixel voltage of the selected pixels. As the selected pixels are distributed over multiple columns, the read-out circuitry is at least partly arranged in each column of the sensor. Typically, each column of the sensor is associated with a respective analog-to-digital converter (ADC) for converting the pixel voltage into a corresponding digital number.

In a known approach for converting the pixel voltages, a global ramp voltage signal is distributed to the ADCs of each column. These ADCs each comprise a comparator that compares the pixel voltage to the ramp voltage signal. Based on the comparison, a digital number is outputted.

A disadvantage of using the known approach is related to conversion time. For example, if an additional bit is required in the digital number to increase the accuracy, the conversion time may be doubled. To overcome this disadvantage, multi-slope ADCs have been proposed in which two consecutive ramp voltage signals are used, wherein the first ramp voltage signal has a higher slope, and wherein the second ramp voltage signal has a lower slope and starts at the last value of the first ramp voltage signal. For example, the first ramp voltage signal could be used for determining the 7 most significant bits of the digital number, whereas the second ramp voltage signal could be used for determining the 7 least significant bits. However, in order for this approach to work, the slopes of the first and second ramp voltage signals must be accurately matched to a known ratio, e.g. 128:1 for the present example, for each column.

Another disadvantage of the known approach is related to the distribution of the global ramp voltage signal, which is typically performed by a distribution network. The electrical length of the distribution network and the electromagnetic coupling between different parts of the read-out circuitry and the distribution network may affect the shape, magnitude, and timing of the ramp voltage signal to such an extent that different columns experience a different ramp voltage signal.

SUMMARY

It is an object of the present invention to provide a method for converting an analog voltage into a digital number in which the abovementioned problems do not occur or at least to a lesser extent.

This object is achieved with the method according to the invention that comprises setting a voltage over a main capacitive element in dependence of the analog voltage, and consecutively performing one or more charge pumping steps. Each charge pumping step comprises performing at least sub-step II of the loop comprising the sub-steps of I) injecting or removing an amount of charge into or from the main capacitive element, respectively, to thereby change the voltage over the main capacitive element, and II) comparing the voltage over the main capacitive element to a reference voltage, and, based on said comparison, either returning to sub-step I) to further change the voltage over the main capacitive element or ending the currently performed charge pumping step and proceeding with a next charge pumping step, if any.

The method according to the invention further comprises calculating the digital number representing the analog voltage based on the net charge that has been injected into or removed from the main capacitive element as a result of having performed the one or more charge pumping steps.

The present invention proposes a different approach for converting analog signals that is not dependent on the global distribution of a ramp voltage signal. Instead, a local charge pumping process is proposed in which the voltage over a main capacitive element, which voltage has for instance been set in dependence of the pixel voltage, is gradually reduced by sequentially pumping charge into or out of the main capacitive element. The applicant has found that it is less complicated to control the magnitude and timing of the charge packets used during the charge pumping process than the abovementioned distribution of a global ramp voltage signal.

Within the context of the present invention, a charge pumping step may comprise one or more sub-steps during which charge packets having a predefined magnitude are inserted into or removed from the main capacitive element. Based on the net charge inserted into or removed from the main capacitive element, the digital number can be computed. As the magnitude of the charge packets is known, it is sufficient to count the number of times that a charge packet is inserted or removed to determine the digital number.

Each charge pumping step can be associated with a respective amount of charge and/or respective reference voltage. This respective reference voltage can be equal to zero. The charge packets that are inserted or removed during a given charge pumping step can be identical in terms of magnitude. Furthermore, the reference voltage that is used for comparing the voltage over the main capacitive element can be different for each charge pumping step. However, the reference voltage is normally identical for the various sub-steps in a given charge pumping step.

Using different amounts of charge to be inserted into or to be removed from the main capacitive element allows a multi-slope conversion.

The amount of charge that is associated with one charge pumping step among two charge pumping steps that are to be performed consecutively can be positive, whereas the amount of charge that is associated with the other charge pumping step among said two consecutive charge pumping steps can be negative. This means that charge is first injected into the main capacitive element during a first charge pumping step, and then removed from the main capacitive element during a second charge pumping step that is consecutive to the first charge pumping step. It should be noted that the order of injecting and removing can be reversed.

The reference voltage for each charge pumping step can be identical, and can be equal to zero.

A magnitude of an amount of charge that is injected or removed during sub-step I) of a charge pumping step that is performed first among two charge pumping steps that are to be performed consecutively, can be a factor $2^n$ larger than the magnitude of an amount of charge corresponding to the other charge pumping step among said two consecutive charge pumping steps, with n being an integer >0. Here, n can be different for different pairs of consecutive charge pumping steps. The skilled person readily understands that the use of a factor $2^n$ is convenient when handling digital numbers that are based on binary numbers, but that the invention is not limited to these factors.

Sub-step II) may comprise, for each charge pumping step, returning to sub-step I) of that charge pumping step if a difference between the voltage over the main capacitive element and the respective reference voltage has not yet decreased during that charge pumping step to be at or below a threshold associated with that charge pumping step. Here, each charge pumping step may use the same threshold. For example, the threshold could be equal to roughly half the voltage change that is induced by removing or injecting a single charge packet. This prevents situations wherein a charge packet is still injected or removed although the voltage over the main capacitive element is less than half the abovementioned voltage change separated from the reference voltage.

The ending of the currently performed charge pumping step may comprise repeating sub-step I) for m times, with m being an integer >0. In this situation, an intentional overshoot is created. The output code is determined by multiple comparator decisions. Therefore, the effective noise contribution of the comparator is reduced as a result of noise averaging.

At least some of the one or more charging steps may comprise repeating sub-step I) at least once before proceeding to sub-step II) at least during an initial part of that charge pumping step. In this case, a plurality of charge packets are inserted or removed before any comparison starts. This may accelerate the conversion process.

The method of the invention may further comprise performing a calibration step prior to step a) for calibrating a first amount of charge, which is associated with a charge pumping step that is performed first among two charge pumping steps that are to be performed consecutively, relative to a second amount of charge, which is associated with the other charge pumping step among said two consecutive charge pumping steps, wherein the first amount of charge is intended to be N times the second amount of charge, with N being an integer >1. The calibration step may comprise:

C0) setting a calibration voltage over the main capacitive element, the calibration voltage preferably being 0 V;

C1) injecting or removing k times the first amount of charge into or from the main capacitive element, respectively, and removing or injecting k times N times the second amount of charge from or into the main capacitive element, respectively, with k being an integer >0;

C2) comparing the voltage over the main capacitive element to a further reference voltage, the further reference voltage preferably being 0V;

C3) if a difference between the voltage over the main capacitive element and the further reference voltage exceeds a threshold, adjusting at least one of the first amount of charge and the second amount of charge and optionally repeating steps C0)-C3). For example, steps C0)-C3) can be repeated on a periodic basis.

Here, N is preferably equal to $2^n$, with n being an integer >1 and the abovementioned threshold may be 0V. When the threshold is 0V the calibration step keeps toggling between different values of the first and/or second amount of charge. This process can be extended such that a calibration step is performed for each possible pair of consecutive charge pumping steps among said one or more charge pumping steps, preferably starting with the two charge pumping steps having the largest amount of charge associated therewith.

Step C1) may comprise injecting or removing the first amount of charge k times, and thereafter removing or injecting the second amount of charge k×N times, respectively. Alternatively step C1) may comprise k times performing the combination of a) the step of injecting or removing the first amount of charge and b) the step of removing or injecting N times the second amount of charge, respectively.

The injecting or removing of an amount of charge may comprise the steps of connecting a voltage source to a charging capacitance for charging the charging capacitance, and disconnecting the voltage source from the charging capacitance and connecting the charging capacitance to the main capacitive element. Moreover, the adjusting of the first and/or second amount of charge, as mentioned above, may comprises adjusting a voltage outputted by the voltage source.

According to a second aspect, the invention provides a converting device for converting an analog voltage into a digital number. This device comprises a main capacitive element, a charge pump device for injecting or removing an amount of charge into or from the main capacitive element, respectively, a comparator for comparing a voltage over the main capacitive element to a reference voltage, and a calculating unit for calculating the digital number representing the analog voltage based on the net charge that has been injected into or removed from the main capacitive element by the charge pump device.

The device further comprises a switching unit for switching the converting device between a voltage setting stage, wherein the main capacitive element is connected to a source of said analog voltage allowing a voltage over the main capacitive element to be set in dependence of the analog voltage, and a charge pumping stage, wherein the charge pump device is connected to the main capacitive element. According to the invention, the controller is configured to control the charge pump device and the switching unit to implement the method as defined in any of the previous claims.

The charge pump device may comprise a separate charge pump unit for each of the one or more charge pumping steps. This allows the multi-slope conversion process as described above. Moreover, each charge pump unit may comprise a charging capacitance, a voltage source for outputting a voltage, a charge pump switch for connecting the voltage source to the charging capacitance element to allow the charging capacitance to charge or for disconnecting the voltage source from the charging capacitance. Here, the controller is preferably configured to control the charge pump switch. Moreover, the voltage outputted by the voltage source can be adjustable. This allows the ratio between the slopes of different charge pumping steps to be equal to a predefined number related to the resolutions associated with each charge pumping step.

The switching unit may comprise one or more switches for either connecting the main capacitive element to a source of the analog voltage to be converted or for disconnecting the main capacitive element from said source. Additionally or alternatively, the switching unit may comprise one or more switches for either connecting the main capacitive element to the charge pump device or for disconnecting the main capacitive element from the charge pump device. Furthermore, the switching unit may comprise respective switches for each charge pump unit to allow each unit to be individually connected to or disconnected from the main capacitive element.

The converting device according to the invention may comprise an amplifier having an input and an output, wherein the charge pump device is connected to the input and wherein the main capacitive element is connected between the input and the output of the amplifier. The amplifier may be an operational amplifier having a non-inverting input, an inverting input, and an output, wherein the charge pump device is connected to the inverting input, wherein the main capacitive element is connected between the inverting input and the output, and wherein the non-inverting input is connected to a control voltage, and wherein the output of the amplifier is connected to the comparator. In this case, the controller can be configured to control the control voltage and/or the voltage outputted by the voltage source of one or more of said separate charge pump units for determining whether charge will be removed from or injected into the main capacitive element. In turn, this will depend on the comparison between the voltage over the main capacitive element and the reference voltage.

The one or more switches for either connecting the main capacitive element to the charge pump device or for disconnecting the main capacitive element from the charge pump device may comprise a first switch arranged in between the input or inverting input of the amplifier or operational amplifier, respectively, and the main capacitive element and a second switch arranged in between the output of the amplifier or operational amplifier and the main capacitive element.

The one or more switches for either connecting the main capacitive element to a source of the analog voltage to be converted or for disconnecting the main capacitive element from said source may comprise a first switch connected in between the source of the analog voltage and a first terminal of the main capacitive element, preferably being the terminal that is connectable to the input of the amplifier or the inverting input of the operational amplifier, and a second switch connected in between a second terminal of the main capacitive element and a base voltage.

The abovementioned switches can be field-effect transistors allowing integration with the pixel array. In some embodiments, the pixel array and the conversion device are based on CMOS technology.

In an embodiment, the main capacitive element comprises a first main capacitive element and a second main capacitive element. In this case, the switching unit may be configured to switch the converting device between a first mode and a second mode. In this first mode, the first main capacitive element is connected to a source of the analog voltage allowing a voltage over the first main capacitive element to be set in dependence of the analog voltage and wherein the charge pump device is connected to the second main capacitive element. In the second mode, the second main capacitive element is connected to the source of the analog voltage allowing a voltage over the second main capacitive element to be set in dependence of the analog voltage and wherein the charge pump device is connected to the first main capacitive element. The analog voltage to be converted during the first mode is preferably different from the analog voltage to be converted during the second mode. When the converting device is in the first mode, an analog voltage that was previously used to charge the second main capacitive element is converted whereas an analog voltage to be converted next is used to charge the first main capacitive element. This latter voltage will be converted when the converting device is put in the second mode. In that mode, a voltage to be converted next will be used to charge the second main capacitive element. According to a third aspect, the present invention provides an imaging system that comprises a photosensitive pixel having a pixel storage capacitance to store a charge in dependence of incoming electromagnetic radiation, and the converting device as described above for converting a pixel voltage over the pixel storage capacitance into a digital number. This system may further comprise an array of columns and rows of said photosensitive sensitive pixels, a selecting unit for selecting a row of pixels, and read-out circuitry for reading out the pixel voltages that correspond to the pixels that are in the selected row, wherein the read-out circuitry comprises the converting device.

The read-out circuitry may comprise a plurality of column-specific parts that are arranged for each column of pixels specifically and which parts offer functionality that is specific to one column of pixels, and a common part that is arranged for every column of pixels and which part offers functionality that is shared by each column of pixels, wherein the controller and calculating unit are preferably arranged in the common part and wherein the main capacitive element, the charge pump, and switching unit are preferably arranged in each column-specific part.

The imaging system may be an X-ray detector or a sensor for an optical camera, although the present invention is not limited to these examples.

BRIEF DESCRIPTION OF THE FIGURES

Next, the invention will be described in more details by referring to the appended drawings, wherein identical reference signs will be used for referring to identical or similar components and wherein.

DETAILED DESCRIPTION

Figure 1:
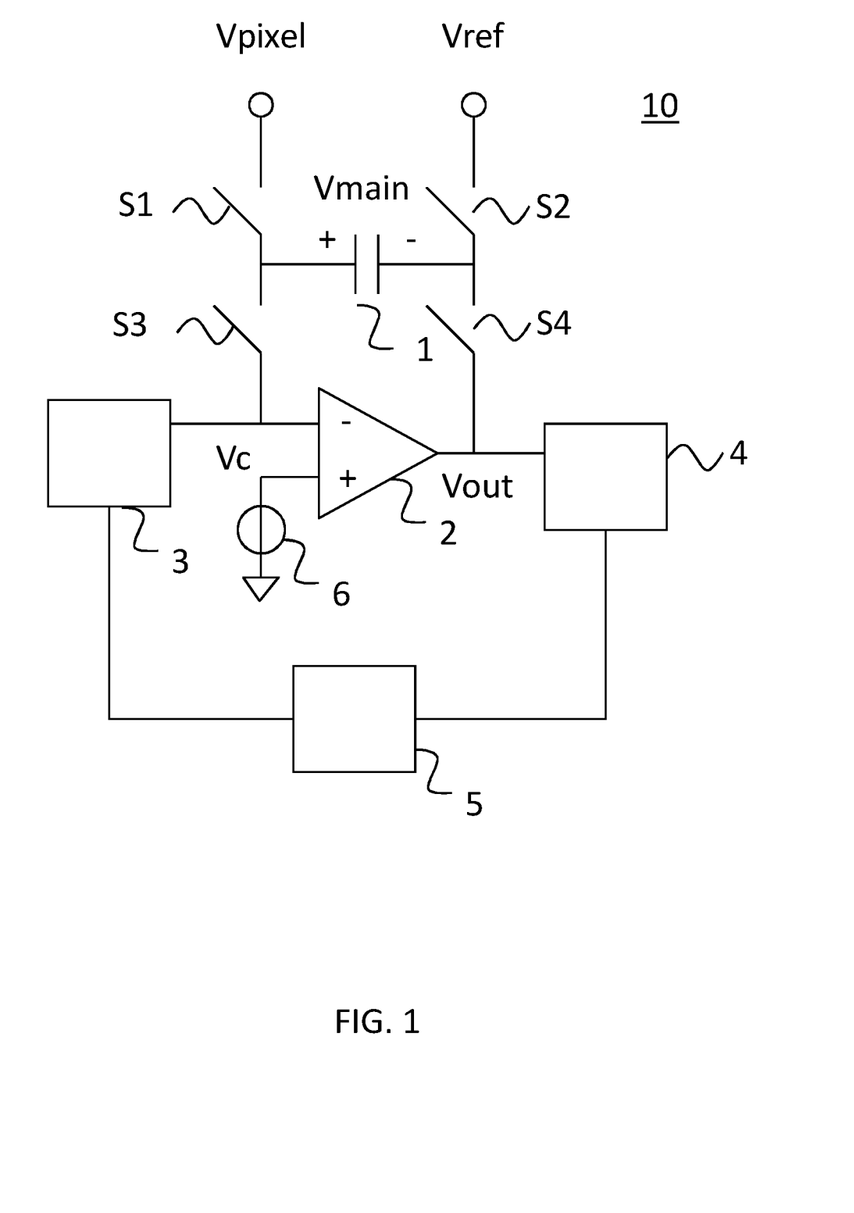
FIG. 1 illustrates a general embodiment of a converting device according to the present invention.

FIG. 1 illustrates a general embodiment of a converting device in accordance with the present invention. Here, a converting device 10 is shown that comprises a main capacitive element 1 in the form of a capacitor. Capacitor 1 can be a fringe or plate capacitor that is part of a CMOS process used for manufacturing a CMOS based pixel array. Capacitor 1 can be coupled to a source of the analog voltage to be converted, in this case Vpixel, by means of a switch S1. In FIG. 1, capacitor 1 is coupled to a buffer that is connected to the storage capacitor of a photosensitive pixel although converting device 10 can be coupled to other sources of analog voltages that need to be converted.

Capacitor 1 is also coupled to a source of a reference voltage Vref by means of a switch S2. When switches S3 and S4 are open and switches S1 and S2 are closed, capacitor 1 can be charged to have a voltage Vmain equal to Vpixel−Vref. Here, it is noted that normally Vref>Vpixel.

Switch S3 connects one terminal of capacitor 1 to the inverting terminal of an operational amplifier 2. The non-inverting terminal of operational amplifier 2 is connected to a voltage source 6, which outputs a voltage Vc. The output of operational amplifier 2 is connected to another terminal of capacitor 1 via a switch S4. In addition, the output of operational amplifier 2 is coupled to a comparator 4, which is configured to compare the output of operational amplifier 2 to a given reference voltage, which may be equal to 0V. Comparator 4 outputs a comparison signal to a controller 5, which controls a charge pump device 3. This latter device is connected to the inverting terminal of operational amplifier 2.

The operation of converting device 10 for converting voltage Vpixel will be described next.

As a first step, switches S1 and S2 are closed, whereas switches S3 and S4 are opened. This allows the voltage over capacitor 1, Vmain, to be set to Vpixel−Vref. Next, switches S1 and S2 are opened, and S3 and S4 are closed. At this stage, V+, being the non-inverting terminal of operational amplifier 2 will be set to Vc, whereas V−, being the inverting terminal of operational amplifier 2, will also be set to Vc. Vmain will remain equal to Vpixel−Vref so that the output Vout of operational amplifier 2 will equal Vc−(Vpixel−Vref).

As a next step, a first charge pumping step will be performed. To this end, comparator 4 will compare Vout to a reference voltage, in this case set to Vc. Based on this comparison, it will control charge pump device 3 to lower the magnitude of Vmain. For example, it will insert a positive charge packet onto the left terminal of capacitor 1 (or remove negative charge therefrom).

Figure 2:
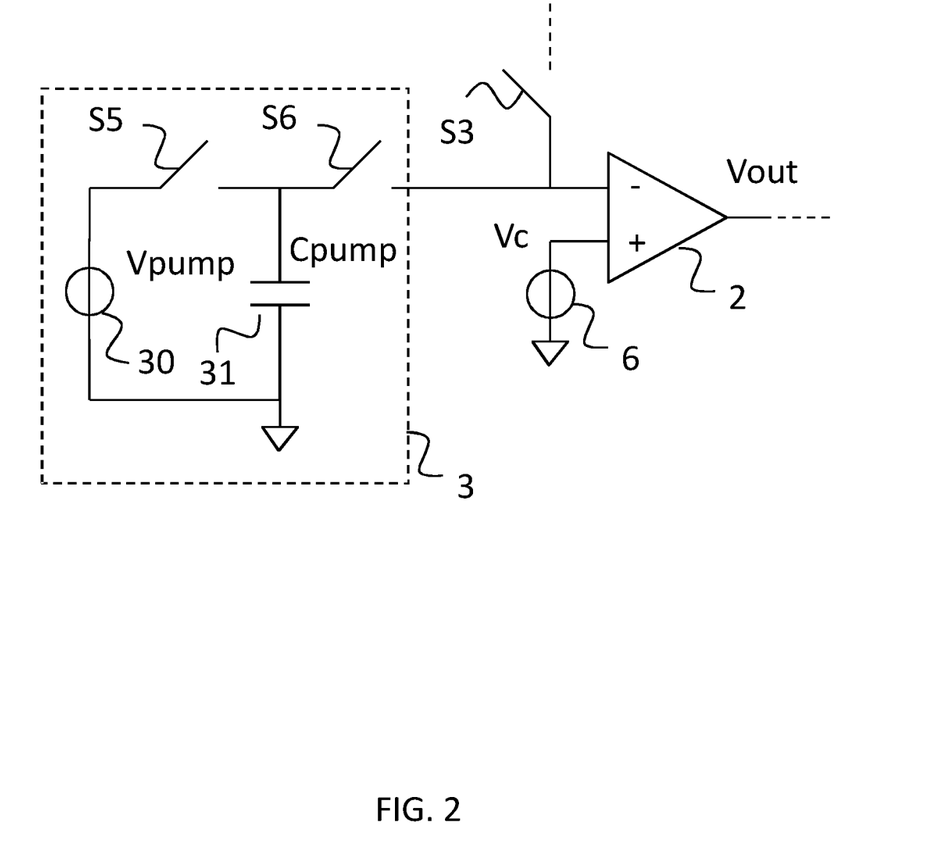
FIG. 2 illustrates an embodiment of a charge pump device used in the converting device in FIG. 1.

FIG. 2 illustrates an embodiment of charge pump device 3. It comprises a voltage source 30 outputting a voltage Vpump. This source can be connected by a switch S5 to a capacitor 31 having a capacitance Cpump. Capacitor 31 can be connected to the inverting terminal of operational amplifier 2 by a switch S6.

Returning to the example above, when controller 5 indicates that a charge packet should be inserted, switch S5 is closed whereas switch S6 is opened. This sets the voltage over capacitor 31 equal to Vpump. As a next step, switch S5 is opened and switch S6 is closed. A charge packet equal to Cpump×(Vpump−Vc) will be injected into capacitor 1. This will decrease Vout by an amount equal to Cpump/Cmain× (Vpump−Vc) thereby lowering the magnitude of Vmain by the same amount. Hence, by controlling Vc and/or Vpump, controller 5 is able to control the direction of change of Vout and Vmain.

After each injection or removal, comparator 4 may compare Vout to the reference voltage, i.e. Vc. Once Vout crosses the reference voltage or is within a given threshold from the reference voltage, comparator 4 may decide to stop the conversion process or to initiate a next charge pumping step wherein a different voltage Vpump and/or a different capacitor Cpump is used. This process is repeated until the voltage over capacitor 1, Vmain, is zero or sufficiently close to zero. It should be noted that if Vmain is indeed zero, then V+=V−=Vout=Vc.

Figure 3:
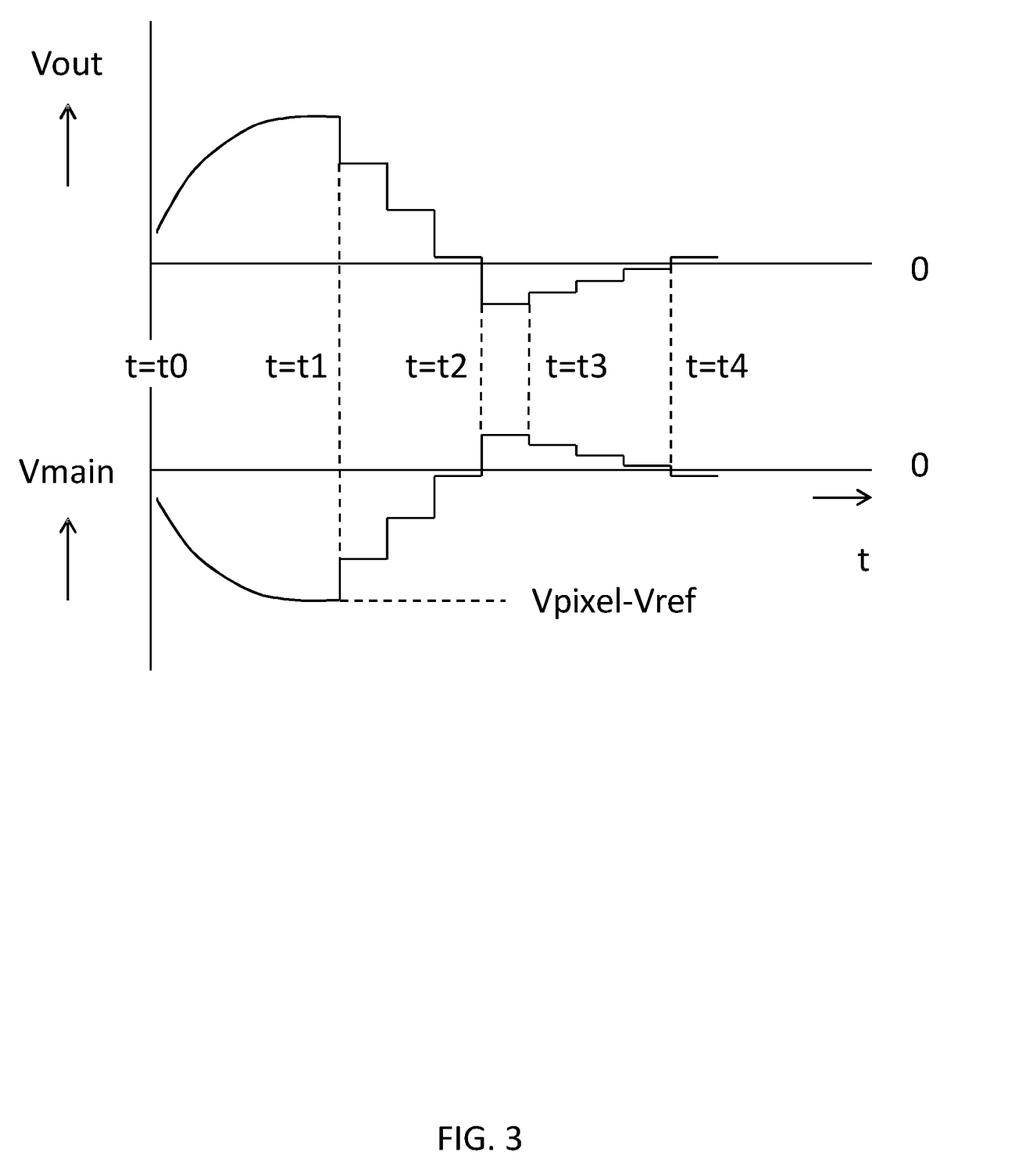
FIG. 3 illustrates Vout and Vmain as a function of time during a dual-slope conversion process.

The resulting Vout and voltage over capacitor 1, Vmain, as a function of time for two subsequent charge pumping steps are illustrated in FIG. 3. Here, voltage Vmain is set during the time period between t=t0 and t=t1. At t=t1, the first charge pumping step starts as a result of which Vout decreases. During this charge pumping step, Vpump>Vc. At t=t2, Vout becomes lower than the reference voltage, which is set equal to Vc. To this end, controller 5 controls comparator 4 to use the same voltage setting as voltage source 6, which it may also control.

Then, at t=t3, a second charge pumping step is initiated using a different voltage Vpump, which will be lower than Vc. During this step, Vout will increase. At t=t4, Vout becomes higher than Vc and the second charge pumping step will end. In this mean time, controller 5 has kept track of the total amount of charge Qnet that was injected into capacitor 1. This allows a quantized version of Vpixel to be computed using Vpixel=Qnet/Cmain. In addition, it allows controller 5 to compute a digital number representing the quantized version of Vpixel. Typically, Vpump and the charge amounts are known during the charge pumping steps. Therefore, only the amount of steps need to be tracked by controller 5 in order to compute a digital number.

In the embodiment of FIG. 2, the pump voltage Vpump and/or voltage Vc needs to be controlled to enable a multi-slope conversion. For these applications, it is important to maintain a particular ratio between the voltage steps in the charge pumping steps. To this end, a calibration can be performed. An embodiment wherein such calibration can be realized is shown in FIG. 4.

Figure 4:
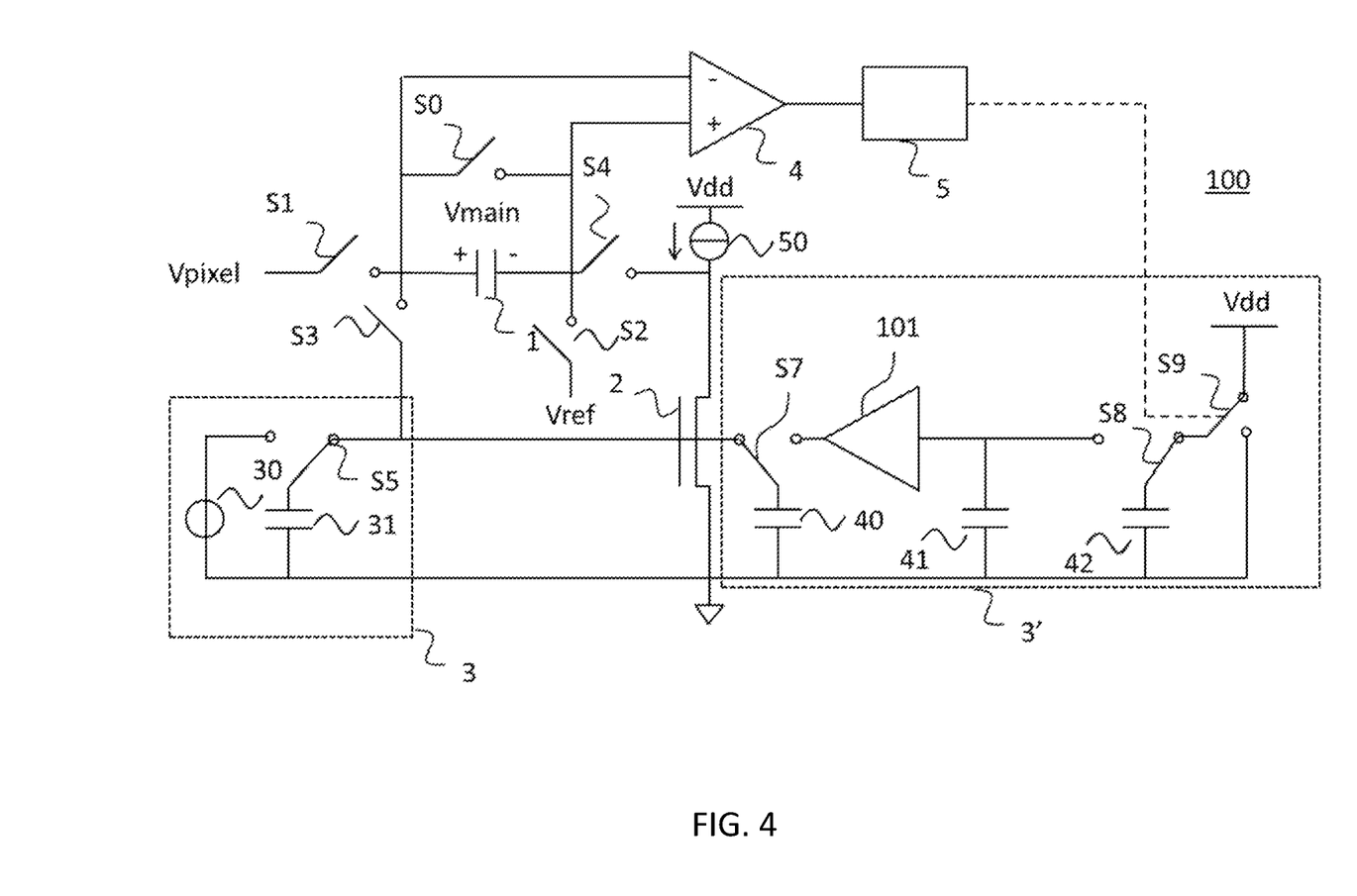
FIG. 4 illustrates a further embodiment of a converting device according to the present invention.

Conversion device 100 in FIG. 4 comprises a field-effect transistor, such as an NMOS FET 2 and current source 50, to perform similar to the operational amplifier 2 in FIG. 1. Here, the gate of FET 2 can be considered as the inverting input of an operational amplifier, whereas the drain can be considered as the output. The source of FET 2 is connected to ground. The drain of FET 2 is connected to current source 50 that has its other terminal connected to supply voltage Vdd.

Charge pump device comprises a first charge pump unit 3 that comprises a voltage source 30 outputting a voltage Vpump1, a first capacitor 31, and a first switch S5 that connects first capacitor 31 either to voltage source 30 or to the gate of FET 2. The operation of first switch S5 is comparable to switches S5 and S6 in FIG. 2.

The charge pump device of conversion device 100 comprises a further charge pump device 3' that comprises a voltage source that is formed using second capacitor 40, buffer 101, and accumulation capacitor 41. It further comprises a third capacitor 42 and a switch S8 that connects third capacitor 42 either to accumulation capacitor 41 and buffer 101 or to an intermediate node. This latter node is connected, via switch S9, either to a higher voltage, e.g. Vdd or to a lower voltage, e.g. ground.

The gate of FET 2 can be connected, via switch S3, to a left terminal of main capacitor 1. The other terminal of main capacitor 1 can by connected, via switch S4, to the drain of FET 2. Similar to the embodiment in FIG. 1, switches S1 and S2 are arranged to set the voltage over main capacitor 1, Vmain, to Vpixel-Vref. A further switch S0 is provided that allows main capacitor 1 to quickly discharge.

Both terminals of main capacitor 1 are connected to a comparator 4 which feeds its comparison signal to a controller 5. This latter controller controls the switches S0-S9 and is configured to output a digital number based on the comparison signal in manner similar to the embodiment in FIG. 1.

The embodiment in FIG. 4 allows a dual-slope operation. Prior to conversion of a pixel voltage, a calibration is performed. This calibration will be described next. At the start, switch S0 is closed to reset the voltage over main capacitor 1, ideally corresponding to 0V. At this stage, switches S1 and S2 are open, whereas switches S3 and S4 are closed. Furthermore, switch S5 connects capacitor 31 to voltage source 30 to allow capacitor 31 to be charged up to Vpump1. Once this charging is completed, S0 is opened and S5 will connect capacitor 31 to the gate of FET 2. Charge will be injected into or remove from main capacitor 1. As the upper terminal of capacitor 31 will be at Vgs, the total amount of charge transferred therefore corresponds to (Vpump1−Vgs)×Cpump1. This will induce a voltage change over main capacitor 1 equal to (Vpump1−Vgs)×Cpump1/Cmain. As the left terminal of capacitor 1 is at Vgs after the charge transfer, the other terminal will assume a voltage equal to Vgs−(Vpump1−Vgs)×Cpump1/Cmain. Here, it is noted that the output resistance of FET 2 is relatively large and the drain current is maintained at a constant value, causing the gate-source bias Vgs to be constant. Leakage from capacitor 1 is prevented by the high input impedance of gate of FET 2.

The voltage over main capacitor 1 is fed to comparator 4. Here, the inverting terminal is connected to the left terminal of capacitor 1 and the non-inverting terminal to the other terminal of capacitor 1.

At this point, charge pump unit 3 has injected/removed one charge packet into main capacitor 1. Next, charge pump unit 3' will inject/remove a charge packet k times. Ultimately, the total charge injected/removed by charge pump unit 3' should be equal to the total charge injected/removed by charge pump unit 3. This is arranged by calibrating the voltage over capacitor 41.

The capacitance of capacitor 41, Cacc, is much larger than that of capacitor 40, Cpump2, and that of capacitor 42, Cchar. It functions as an accumulation capacitor keeping the voltage to be used during the second charge pumping step relatively constant. The total charge stored in capacitor 41 can be controlled as follows. First, switches S8 and S9 are operated to connect capacitor 42 to Vdd or ground. Next, switch S8 connects capacitor 42 to capacitor 41. This will pump charge into or remove charge from capacitor 41. The voltage over capacitor 41 is fed to capacitor 40 via buffer 101 and switch S7. By controlling switches S8 and S9, the voltage that is used to charge capacitor 40, referred to as Vpump2, can be controlled.

Assuming an initial charge present in capacitor 41, switches S7 and S3 are controlled to k times inject/remove a charge packet equal to (Vpump2−Vgs)×Cpump2. This will cause a voltage change over capacitor 1 equal to k×(Vpump2−Vgs)×Cpump2/Cmain. Consequently, after having charges injected by the first and second charge pump units 3, 3', the net voltage over capacitor 1 will be equal to (Vpump1−Vgs)×Cpump1/Cmain+k×(Vpump2−Vgs)× Cpump2/Cmain. Ideally, this voltage should be zero. This can be for instance be achieved when Cpump1=k×Cpump2 and Vpump1=1.5×Vgs and Vpump2=0.5×Vgs.

Based on the comparison signal after k times injecting/ removing the charge packet by charge pump unit 3', controller 5 can decide to either increase Vpump2 by connecting capacitor 42 first to Vdd and then to capacitor 41, using switches S8 and S9, or to decrease Vpump2 by connecting capacitor 42 first to ground and then to capacitor 41.

This calibration step can be performed prior to every conversion step or at regular intervals for example to track temperature and supply voltage variations. After calibration, switches S1 and S2 can be operated to set to the voltage over main capacitor 1 equal to Vpixel-Vref. During the subsequent conversion, charge pump unit 3, 3' are sequentially operated as described in conjunction with FIG. 1.

In the embodiment of FIG. 1, comparator 4 outputs a positive comparison signal when the voltage at the non-inverting terminal exceeds that of the inverting terminal. Under normal operating conditions, Vpixel<Vdd and Vpixel<Vref. Consequently, during the first charge pumping step, positive charge packets should be injected into main capacitor 1. When the sign of the comparison signal changes, the next charge pumping step should be initiated. During this step, negative charge packets should be injected (or positive charge packets removed). When the sign of the comparison signal changes again, the conversion process may end or a next step may be executed.

Assuming that Cpump1=64 fF, Cpump2=1 fF, Cacc=1 pF, and Cchar=1 fF and Vpump1=1.5×Vgs and Vpump2=0.5× Vgs, it can be computed that the charge packets transferred during the first charge pumping step are 64 times larger than the charge packets exchanged during the second charge pumping step but opposite in sign. Moreover, during the first charge pumping step, the value of the most significant 6 bits are determined in the example wherein maximum 64 steps are performed. During the second charge pumping step, the value of the least significant 6 bits are determined. These determinations are based on the number of times that a charge packet is exchanged. For example, assuming that m charge packets are required to change the sign of the comparison signal during the first charge sampling step and that n charge packets are required to change the sign of the comparison signal during the second charge sampling step, then the digital number can be computed by subtracting the digital number [0 0 0 0 0 0 b5 b4 b3 b2 b1 b0] from [b11 b10 b9 b8 b7 b6 0 0 0 0 0 0], where b11-b6 are the digital representation of m and wherein b5-b0 are the digital representation of n.

The comparison performed by comparator 4 need not be performed each time a charge packet is injected or removed. For example, during a charge pumping step, a given charge packet can be transferred a number of times before any comparison is performed. In this manner, the voltage over main capacitor 1 can be reduced faster as the comparison process requires a finite amount of time. A drawback is that the accuracy is reduced. At the end of the step, the maximum voltage is n times larger, wherein n is the number of repeated pumps. If the reference voltage is increased during initial pumping, and after the zero-crossing is restored to the normal value, and the step is completed by regular pumping, this disadvantage is removed.

The abovementioned overshoot and charge transfer without comparison is made possible due to the fact that controller 5 computes the digital number based on the final amount of exchanged charge packets.

Figure 5:
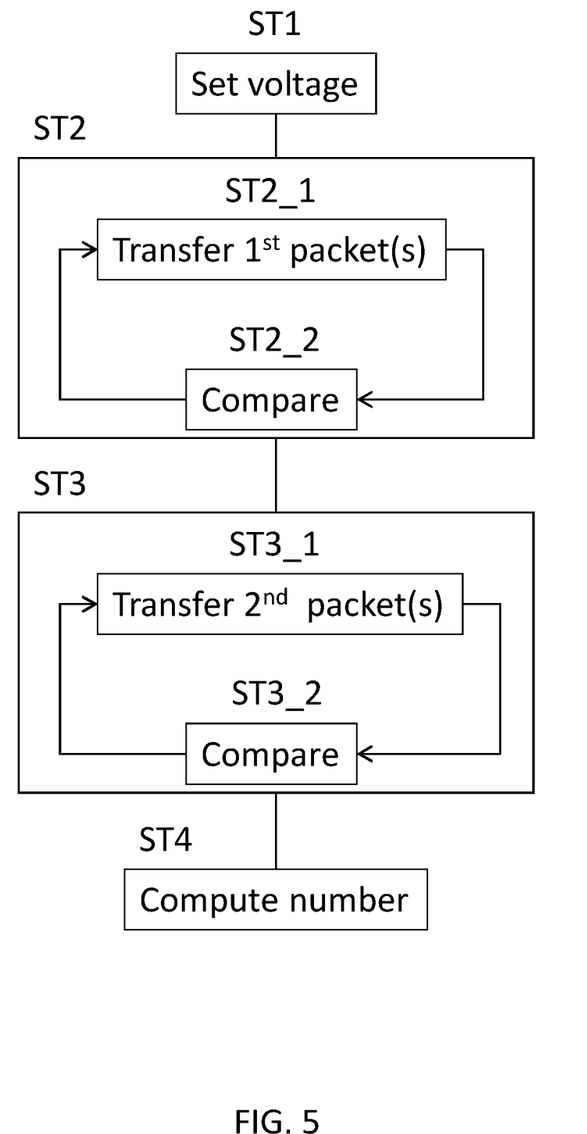
FIG. 5 illustrates a method in accordance with the present invention.

FIG. 5 illustrates an example of a method in accordance with the present invention. This method is used in the embodiments of FIGS. 1 and 4. As a first step ST1, the voltage over the main capacitor 1 is set in dependence of the voltage to be converted. As a next step ST2, a loop is performed. This loop comprises the sub-steps of ST2_I: injecting or removing a first charge packet into or from the main capacitive element, and ST2_II: comparing the voltage over the main capacitive element to a reference voltage, and, based on said comparison, either returning to sub-step 1) to further change the voltage over the main capacitive element or ending the currently performed charge pumping step and proceeding with the next charge pumping step ST3. The loop performed at step ST2 starts either at step ST2_I or at step ST2_II.

Step ST3 also comprises a loop. This loop comprises the sub-steps of ST3_I: injecting or removing a first charge packet into or from the main capacitive element, and ST3_II: comparing the voltage over the main capacitive element to a reference voltage, and, based on said comparison, either returning to sub-step I) to further change the voltage over the main capacitive element or ending the currently performed charge pumping step. The loop performed at step ST3 starts either at step ST3_I or at step ST3_II.

After ending the second charge pumping step, the digital number representing the analog voltage is calculated in step ST4 based on the net charge that has been injected into or removed from the main capacitive element as a result of having performed the first and second charge pumping steps.

It should be apparent to the skilled person that, although the present invention has been described using detailed embodiments thereof, the scope of protection of the invention is not limited by these embodiments. On the contrary, various modifications can be made to the embodiments without departing from the scope of the invention which is defined by the appended claims and their equivalents. For example, the embodiment in FIG. 4 is directed to a dual slope solution. The skilled person would understand that additional charge pump units, similar to unit 3 or 3' can be added to further improve the resolution of the conversion.

The invention claimed is:

1. A method for converting an analog voltage into a digital number, comprising:
   a) setting a voltage over a main capacitive element in dependence of the analog voltage;
   b) consecutively performing one or more charge pumping steps, each charge pumping step comprising performing at least sub-step II of the loop comprising the sub-steps of:
      I) injecting or removing an amount of charge into or from the main capacitive element, respectively, to thereby change the voltage over the main capacitive element; and
      II) comparing the voltage over the main capacitive element to a reference voltage, and, based on said comparison, either returning to sub-step I) to further change the voltage over the main capacitive element or ending the currently performed charge pumping step and proceeding with a next charge pumping step, if any;
   c) calculating the digital number representing the analog voltage based on the net charge that has been injected into or removed from the main capacitive element as a result of having performed said one or more charge pumping steps; and
   performing a calibration step prior to step a) for calibrating a first amount of charge, which is associated with a charge pumping step that is performed first among two charge pumping steps that are to be performed consecutively, relative to a second amount of charge, which is associated with the other charge pumping step among said two consecutive charge pumping steps, wherein the first amount of charge is intended to be N times the second amount of charge, N being an integer >1, said calibration step comprising:
      C0) setting a calibration voltage over the main capacitive element, the calibration voltage preferably being 0 V;
      C1) injecting or removing k times the first amount of charge into or from the main capacitive element, respectively, and removing or injecting k times N times the second amount of charge from or into the main capacitive element, respectively, with k being an integer >0;
      C2) comparing the voltage over the main capacitive element to a further reference voltage, the further reference voltage preferably being 0 V; and
      C3) if a difference between the voltage over the main capacitive element and the further reference voltage exceeds a threshold, adjusting at least one of the first amount of charge and the second amount of charge and optionally repeating steps C0)-C3);
   wherein N is preferably equal to $2^n$, with n being an integer >1.

2. The method according to claim 1, wherein each charge pumping step is associated with a respective amount of charge and/or respective reference voltage.

3. The method according to claim 2, wherein an amount of charge that is associated with one charge pumping step among two charge pumping steps that are to be performed consecutively is positive, and wherein an amount of charge that is associated with the other charge pumping step among said two consecutive charge pumping steps is negative.

4. The method according to claim 1, wherein the reference voltage for each charge pumping step is identical, preferably equal to zero.

5. The method according to claim 1, wherein a magnitude of an amount of charge that is injected or removed during sub-step I) of a charge pumping step that is performed first among two charge pumping steps that are to be performed consecutively, is a factor $2^n$ larger than the magnitude of an amount of charge corresponding to the other charge pumping step among said two consecutive charge pumping steps, with n being an integer >0.

6. The method according to claim 1, wherein sub-step II) comprises, for each charge pumping step, returning to sub-step I) of that charge pumping step if a difference between the voltage over the main capacitive element and the respective reference voltage has not yet decreased during that charge pumping step to be at or below a threshold associated with that charge pumping step.

7. The method according to claim 1, wherein said ending the currently performed charge pumping step comprises repeating sub-step I) for m times, with m being an integer >0.

8. The method according to claim 1, wherein step C1) comprises:
   injecting or removing the first amount of charge k times, and thereafter removing or injecting the second amount of charge k×N times, respectively; or k times performing the combination of a) the step of injecting or removing the first amount of charge and b) the step of removing or injecting N times the second amount of charge, respectively.

9. The method according to claim 1, wherein said injecting or removing of an amount of charge comprises the steps of:
connecting a voltage source to a charging capacitance for charging the charging capacitance; and
disconnecting the voltage source from the charging capacitance and connecting the charging capacitance to the main capacitive element.

10. A converting device for converting an analog voltage into a digital number, comprising:
a main capacitive element;
a charge pump device for injecting or removing an amount of charge into or from the main capacitive element, respectively;
a comparator for comparing a voltage over the main capacitive element to a reference voltage;
a calculating unit for calculating the digital number representing the analog voltage based on the net charge that has been injected into or removed from the main capacitive element by the charge pump device;
a switching unit for switching the converting device between:
  a voltage setting stage, wherein the main capacitive element is connected to a source of said analog voltage allowing a voltage over the main capacitive element to be set in dependence of the analog voltage; and
  a charge pumping stage, wherein the charge pump device is connected to the main capacitive element;
wherein the controller is configured to control the charge pump device and the switching unit to implement a method for converting an analog voltage into a digital number, the method comprising:
  a) setting a voltage over a main capacitive element in dependence of the analog voltage;
  b) consecutively performing one or more charge pumping steps, each charge pumping step comprising performing at least sub-step II of the loop comprising the sub-steps of:
    I) injecting or removing an amount of charge into or from the main capacitive element, respectively, to thereby change the voltage over the main capacitive element; and
    II) comparing the voltage over the main capacitive element to a reference voltage, and, based on said comparison, either returning to sub-step I) to further change the voltage over the main capacitive element or ending the currently performed charge pumping step and proceeding with a next charge pumping step, if any;
  c) calculating the digital number representing the analog voltage based on the net charge that has been injected into or removed from the main capacitive element as a result of having performed said one or more charge pumping steps; and
  performing a calibration step prior to step a) for calibrating a first amount of charge, which is associated with a charge pumping step that is performed first among two charge pumping steps that are to be performed consecutively, relative to a second amount of charge, which is associated with the other charge pumping step among said two consecutive charge pumping steps, wherein the first amount of charge is intended to be N times the second amount of charge, N being an integer >1, said calibration step comprising:
    C0) setting a calibration voltage over the main capacitive element, the calibration voltage preferably being 0 V;
    C1) injecting or removing k times the first amount of charge into or from the main capacitive element, respectively, and removing or injecting k times N times the second amount of charge from or into the main capacitive element, respectively, with k being an integer >0;
    C2) comparing the voltage over the main capacitive element to a further reference voltage, the further reference voltage preferably being 0 V; and
    C3) if a difference between the voltage over the main capacitive element and the further reference voltage exceeds a threshold, adjusting at least one of the first amount of charge and the second amount of charge and optionally repeating steps C0)-C3);
  wherein N is preferably equal to $2^n$, with n being an integer >1.

11. The converting device according to claim 10, wherein the charge pump device comprises a separate charge pump unit for each of the one or more charge pumping steps.

12. The converting device according to claim 11, wherein each charge pump unit comprises:
a charging capacitance;
a voltage source for outputting a voltage; and
a charge pump switch for connecting the voltage source to the charging capacitance element to allow the charging capacitance to charge or for disconnecting the voltage source from the charging capacitance;
wherein the controller is preferably configured to control the charge pump switch.

13. The converting device according to claim 10, comprising an amplifier having an input and an output, wherein the charge pump device is connected to the input and wherein the main capacitive element is connected between the input and the output of the amplifier.

14. The converting device according to claim 13, wherein the amplifier is an operational amplifier having a non-inverting input, an inverting input, and an output, wherein the charge pump device is connected to the inverting input, wherein the main capacitive element is connected between the inverting input and the output, and wherein the non-inverting input is connected to a control voltage, and wherein the output of the amplifier is connected to the comparator.

15. The converting device according to claim 10, wherein the main capacitive element comprises a first main capacitive element and a second main capacitive element, wherein the switching unit is configured to switch the converting device between:
a first mode, wherein the first main capacitive element is connected to the source of said analog voltage allowing a voltage over the first main capacitive element to be set in dependence of the analog voltage and wherein the charge pump device is connected to the second main capacitive element; and
a second mode, wherein the second main capacitive element is connected to the source of said analog voltage allowing a voltage over the second main capacitive element to be set in dependence of the analog voltage and wherein the charge pump device is connected to the first main capacitive element;

wherein the analog voltage to be converted during the first mode is preferably different from the analog voltage to be converted during the second mode.

16. An imaging system comprising:
a photosensitive pixel having a pixel storage capacitance to store a charge in dependence of incoming electromagnetic radiation; and
the converting device as claimed in claim 10, for converting a pixel voltage over the pixel storage capacitance into a digital number.

17. The imaging system according to claim 16, comprising:
an array of columns and rows of said photosensitive sensitive pixels;
a selecting unit for selecting a row of pixels; and
read-out circuitry for reading out the pixel voltages that correspond to the pixels that are in the selected row, wherein the read-out circuitry comprises said converting device.

18. The imaging system according to claim 17, wherein the read-out circuitry comprises a plurality of column-specific parts that are arranged for each column of pixels specifically and which parts offer functionality that is specific to one column of pixels, and a common part that is arranged for every column of pixels and which part offers functionality that is shared by each column of pixels, wherein the controller and calculating unit are arranged in the common part and wherein the main capacitive element, the charge pump, and switching unit are arranged in each specific part.

19. The imaging system according to claim 16, wherein the imaging system is an X-ray detector or a sensor for an optical camera.

* * * * *